US006816028B2

(12) United States Patent
Kato

(10) Patent No.: US 6,816,028 B2
(45) Date of Patent: Nov. 9, 2004

(54) MULTILAYER SUBSTRATE AND SATELLITE BROADCAST RECEPTION APPARATUS

(75) Inventor: Masahiro Kato, Nagaokakyo (JP)

(73) Assignee: Sharp Kabushiki Kaisha, Osaka (JP)

( * ) Notice: Subject to any disclaimer, the term of this patent is extended or adjusted under 35 U.S.C. 154(b) by 25 days.

(21) Appl. No.: 10/401,581

(22) Filed: Mar. 31, 2003

(65) Prior Publication Data

US 2003/0197573 A1 Oct. 23, 2003

(51) Int. Cl.$^{7}$ .................................................. H03H 5/00
(52) U.S. Cl. ........................................... 333/26; 333/33
(58) Field of Search ................................ 333/21 R, 26, 333/33, 246, 247

(56) References Cited

U.S. PATENT DOCUMENTS

2003/0103006 A1 * 6/2003 Yamada ............... 343/700 MS
2003/0189517 A1 * 10/2003 Imai .................... 343/700 MS

FOREIGN PATENT DOCUMENTS

JP 5-183328 A 7/1993

* cited by examiner

*Primary Examiner*—Quan Tra
(74) *Attorney, Agent, or Firm*—Birch, Stewart, Kolasch & Birch, LLP

(57) ABSTRACT

A multilayer substrate ensuring transmission loss as low as when one double-sided substrate is used, while reducing noise, and an LNB converter are provided. The multilayer substrate includes a four-layer substrate having pattern layers sandwiching dielectric layers therebetween. The surface pattern layer provided with a signal line of the microstrip line has a projecting portion. The pattern layer provided with a ground pattern corresponding to the signal line has a portion at least overlapping a root portion of the projecting portion as seen from the top and constituting a surface layer on the other side opposite to the root portion, with no other pattern layer interposed between the relevant portions.

11 Claims, 12 Drawing Sheets

MULTILAYER SUBSTRATE AND SATELLITE BROADCAST RECEPTION APPARATUS

BACKGROUND OF THE INVENTION

1. Field of the Invention

The present invention relates to a multilayer substrate for use in a satellite broadcast reception apparatus, or a low noise block-down (LNB) converter, employed in satellite broadcasting and satellite communication, and a satellite broadcast reception apparatus (hereinafter, referred to as the "LNB converter") using the relevant multilayer substrate.

2. Description of the Background Art

As a substrate for use in the LNB converter, a so-called double-layer substrate (double-sided substrate) has been employed conventionally. As shown in FIG. 10, the double-layer substrate has a substrate dielectric layer 105 formed of a base material of teflon (R) having its both sides plated with copper to form microstrip lines 101, 102. In the microstrip lines, as shown in FIG. 11, a circuit pattern to be a signal line is formed on the front layer of the substrate, and the entire rear layer is grounded, to obtain low-loss and stable transmission characteristic. That is, as shown in FIG. 12, a radiowave signal having propagated through a waveguide 113 is introduced into a space surrounded by a frame 112 and a chassis 111, and is transmitted via a probe 120 into the microstrip line formed in the front layer 101 of double-layer substrate 110. FIG. 13 shows the structure of a portion of the double-layer substrate in FIG. 12 in the vicinity of the transmitting portion. A projecting portion 101*a* constituting probe 120 projecting into a through hole 121 is provided on a projecting portion of substrate dielectric layer 105 continued from the signal line of the microstrip line. In the case where a circuit of the LNB converter is formed on the substrate, it is still advantageous to employ the double-layer substrate in that the entire rear side of the substrate is grounded to keep the overall earth state constant.

With recent advancement of multi-channel satellite broadcasting and satellite communication as well as reception from multiple satellites, there is a trend to replace a reception system using a plurality of LNB converters with a reception system using a signal LNB converter. Such an LNB converter in the future will be required to accommodate conventional LNB circuits within a single LNB converter without any problems. Further, the future LNB converter will have to switch and distribute signals for output. Thus, good isolation of the signals preventing interference therebetween will be highly required.

With the conventional double-layer substrate used in the LNB converter, signal lines inevitably cross with each other. Thus, a method to forcibly separate signals using a semi-rigid cable or the like has conventionally been employed. In the LNB converter adapted to the recent multi-satellite system, the signal crossing portion has become further complicated, of which assembly is physically difficult.

A possible solution therefor is to use a multilayer substrate as shown in FIG. 14. This multilayer substrate has pattern layers of first layer 101, second layer 102, third layer 103 and fourth layer 104, with two substrate dielectric layers 105, 107 and a bonding insulating layer 106 arranged therebetween. The multilayer substrate, as shown in FIG. 15, has two double-layer substrates as its base, which are bonded together by the bonding insulating layer 106. Thus, this multilayer substrate has a four-layer configuration, with a front pattern and a rear pattern included in the respective double-layer substrate. It is also possible to provide multilayer configurations of four layers, six layers and eight layers, by laminating the corresponding numbers of double-layer substrates.

In the multilayer substrate for use in the LNB converter, parts can be mounted on the outermost layers or the surface layers, e.g., the first and fourth layers in the case of the four-layer substrate shown in FIG. 16. The microstrip line pattern can also be formed in the surface layers. At this time, a pattern corresponding to a ground layer with respect to the microstrip line is formed in an inner layer that is unseen from the surface of the substrate, e.g., in the second and third layers in the case of the four-layer substrate.

With the multilayer substrate formed by laminating double-layer substrates as described above, however, the ground layer arranged in the inner layer is electrically isolated from an enclosure to which the substrate is secured. Thus, it is likely to suffer transmission loss especially with a high frequency, which becomes the stumbling block preventing the use of the multilayer substrate compared to the double-layer substrate.

As described above, the connection between the probe and the substrate circuit in the double-layer substrate as in FIGS. 12 and 13 permits low-loss power supply. This is because the portion in the vicinity of the probe is surrounded by the metal chassis and frame to prevent radiowave leakage and thus to minimize the transmission loss. With the multilayer substrate, e.g., the four-layer substrate, if the microstrip line pattern is provided in the first layer and the ground pattern is provided in the second, inner layer, the configuration as in FIGS. 12 and 13 cannot be provided. In this case, intervention of the third and fourth pattern layers results in considerable degradation of transmission characteristic. That is, in the case of the double-layer substrate, the double-layer substrate is sandwiched between the chassis and the frame to prevent the radiowave leakage, and, at the same time, the ground for the probe and the ground surface of the circuit connecting portion are commonly provided to sufficiently stabilize the earth. By comparison, in the case of the four-layer substrate, it is difficult to ensure good contact between the ground for the circuit provided in the inner pattern layer and the ground for the chassis. That is, an additional double-layer substrate is inserted between the ground pattern on the rear surface of the double-layer substrate and the chassis, considerably degrading the transmission characteristic. Currently, this obstructs the use of the multilayer substrate in the LNB converter.

SUMMARY OF THE INVENTION

An object of the present invention is to provide a multilayer substrate which prevents noise and crosstalk that are likely to occur in multichannel transmission/reception and which ensures transmission loss as low as when one double-layer substrate is employed, and an LNB converter using such a multilayer substrate.

The LNB converter according to the present invention is provided with a multilayer substrate having a microstrip line and a probe, and causes a radiowave signal from an antenna to propagate through a waveguide to transmit through the probe to the microstrip line. The multilayer substrate is provided with a wave-guiding through hole, and the probe is provided to project from the multilayer substrate into the through hole. Of the multilayer substrate, a pattern layer constituting a surface layer on one side is provided with a signal line of the microstrip line and a projecting portion constituting a portion of the probe. Another pattern layer provided with a ground pattern corresponding to the signal line has a portion at least overlapping a root portion of the projecting portion as seen from the top and constituting a surface layer on the other side opposite to the root portion. There is no other pattern layer interposed between the root portion and the portion constituting the surface layer on the other side.

The portion constituting the surface layer on the other side opposite to the root portion may be a portion of a substrate surface layer (the undermost layer) on the other side with respect to the substrate surface layer (the topmost layer) of the multilayer substrate in which the projecting portion of the probe is provided. Alternatively, it may be a portion of an inner pattern layer that is exposed by removing a corresponding portion of the undermost layer to provide a surface layer.

In other words, the present invention provides any of the following structures (1) through (3) in the LNB converter configured with the multilayer substrate, to reduce transmission loss of a high-frequency signal. (1) The structure in which a ground layer is formed of a substrate surface pattern that can contact the earth of the enclosure such as a chassis, rather than an inner pattern layer. (2) The structure in which a ground layer corresponding to the signal line is formed by processing and exposing the inner pattern layer, which is made to contact the enclosure such as a chassis. (3) The structure in which the multilayer substrate as in the structure (1) is employed to form the ground portion with the substrate surface layer pattern, to reduce transmission loss and to facilitate assembly of the LNB converter.

With the above-described structures (1) through (3), the advantageous features of the multilayer substrate can be enjoyed to the full extent, while ensuring low-loss transmission characteristic. That is, the LNB converter employing the multilayer substrate has the advantages including downsizing by virtue of the multi-layered structure, simplification of complicated wiring, facilitation of assembly, and improvement of reliability. This can generally lead to reduction of manufacturing cost, although the substrate cost is currently still expensive as a single item, with only a small number of such substrates available.

The present invention provides the following effects. In an LNB converter receiving signals from multiple satellites where the signals inevitably cross with each other, the external cable conventionally employed becomes unnecessary. Instead, the multilayer substrate, simple in assembly, can be employed to realize an LNB converter ensuring high-level isolation and high performance with less transmission loss. As an increasing number of multilayer substrates are adapted to the LNB converters, the substrate unit price will decrease, which will further promote downsizing of the existing LNB converters.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1:
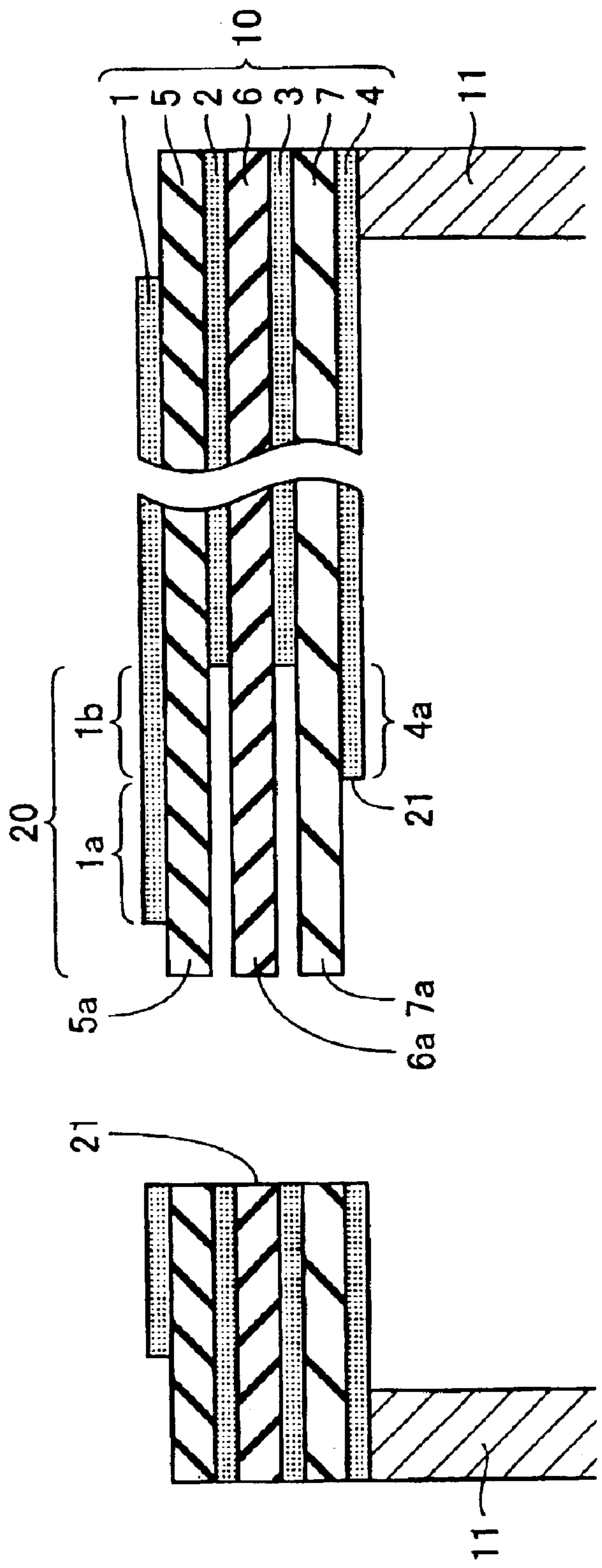
FIG. 1 is a cross sectional view of a multilayer substrate used in an LNB converter according to a first embodiment of the present invention.

FIG. 1 is a cross sectional view of the multilayer substrate used in an LNB converter according to the first embodiment of the present invention. This multilayer substrate 10 has two double-sided substrates bonded together by a bonding insulating layer 6. Multilayer substrate 10 is provided with a through hole 21, and a probe 20 is provided to project into through hole 21. Probe 20 is formed of a projecting portion 1*a* which projects from a first pattern layer 1 provided with a microstrip line, and projecting portions 5*a*, 7*a*, 6*a* which project from two substrate insulating layers 5, 7 and insulating layer 6.

Another surface pattern layer 4 other than the first pattern layer 1 has a portion 4*a* arranged opposite to a root portion 1*b* of the projecting portion 1*a* of the first layer. There is no other pattern layer interposed between the root portion 1*b* and the portion 4*a* opposite to the root portion 1*b*. A ground pattern is provided in the fourth pattern layer 4. This ground pattern contacts chassis 11 in the peripheral portion.

Figure 2:
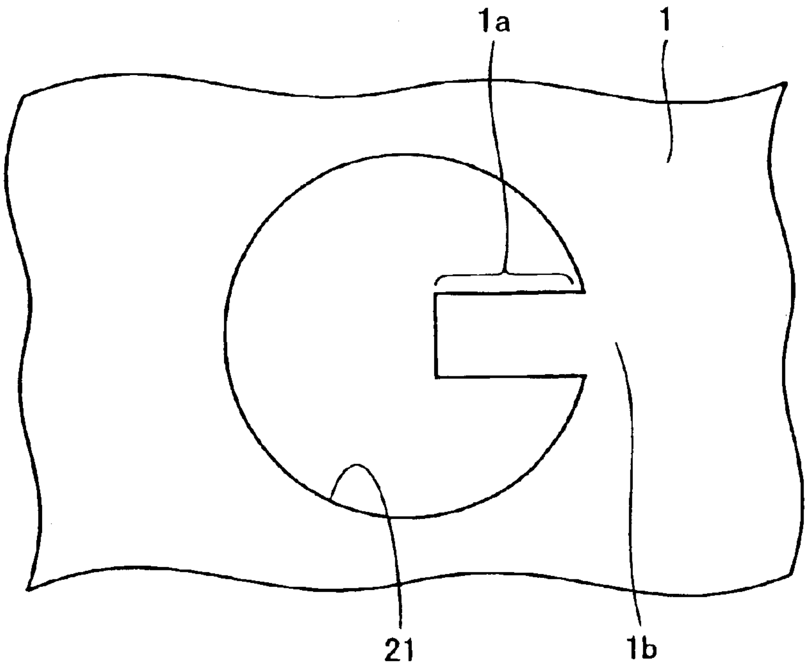
FIG. 2 is a top plan view of the first pattern layer of the multilayer substrate shown in FIG. 1 in the vicinity of a through hole.
Figure 3:
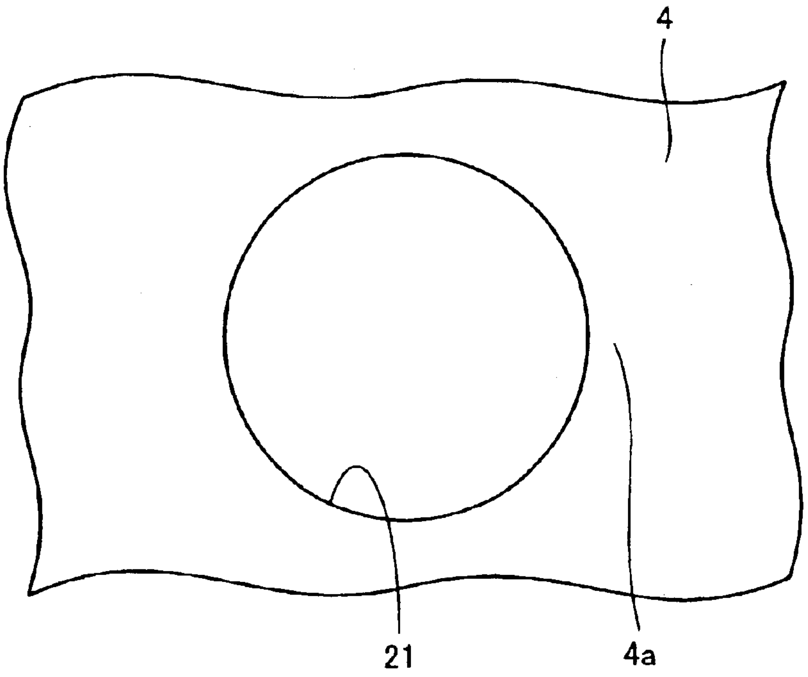
FIG. 3 is a top plan view of the fourth pattern layer of the multilayer substrate shown in FIG. 1 in the vicinity of the through hole.
Figure 4:
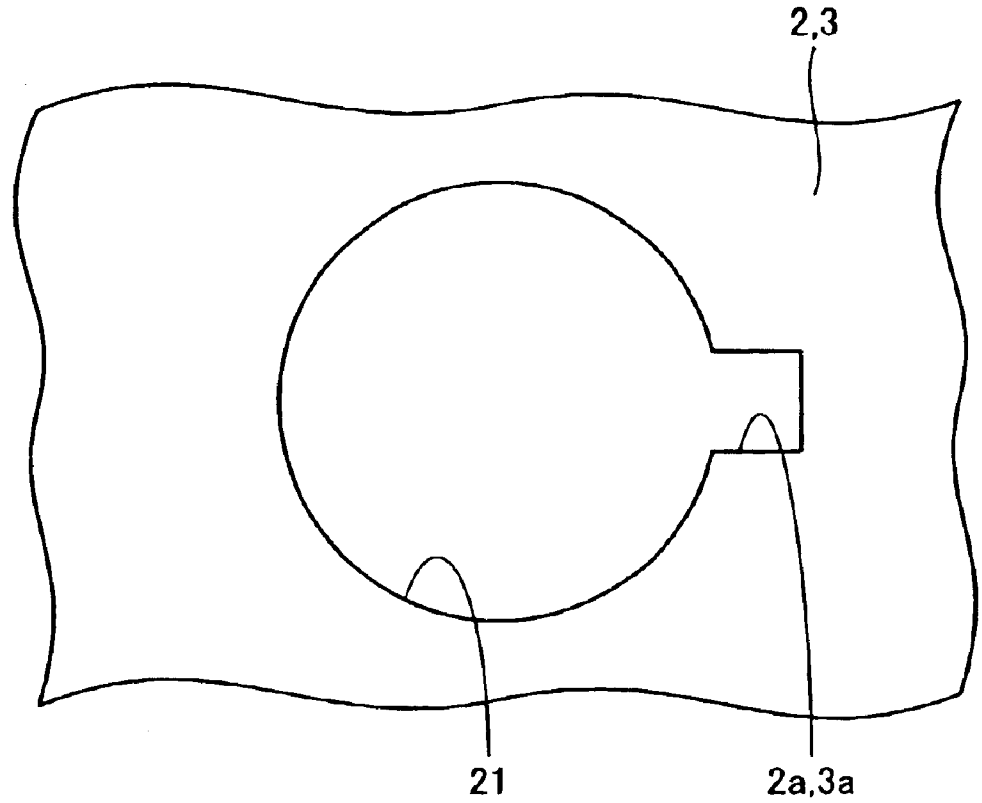
FIG. 4 is a top plan view of the second and third pattern layers of the multilayer substrate shown in FIG. 1 in the vicinity of the through hole.

FIG. 2 is a top plan view showing a portion of the first pattern layer of multilayer substrate 10 shown in FIG. 1 surrounding the through hole. Projecting portion 1*a* projects into through hole 21, forming a portion of the probe. FIG. 3 is a top plan view of a portion of the fourth pattern layer surrounding the through hole. As seen from the top, portion 4*a* corresponding to projecting portion 1*a* forms the surface layer portion on the rear side, with no other pattern layer interposed between itself and projecting portion 1*a* of the first layer. FIG. 4 is a top plan view of the second and third pattern layers 2, 3. Second and third pattern layers 2, 3 have concave portions 2*a*, 3*a* which are continued from through hole 21 so as not to intervene between root portion 1*b* of the first layer and the portion 4*b* of the fourth layer corresponding to the root portion 1*b*.

Figure 5:
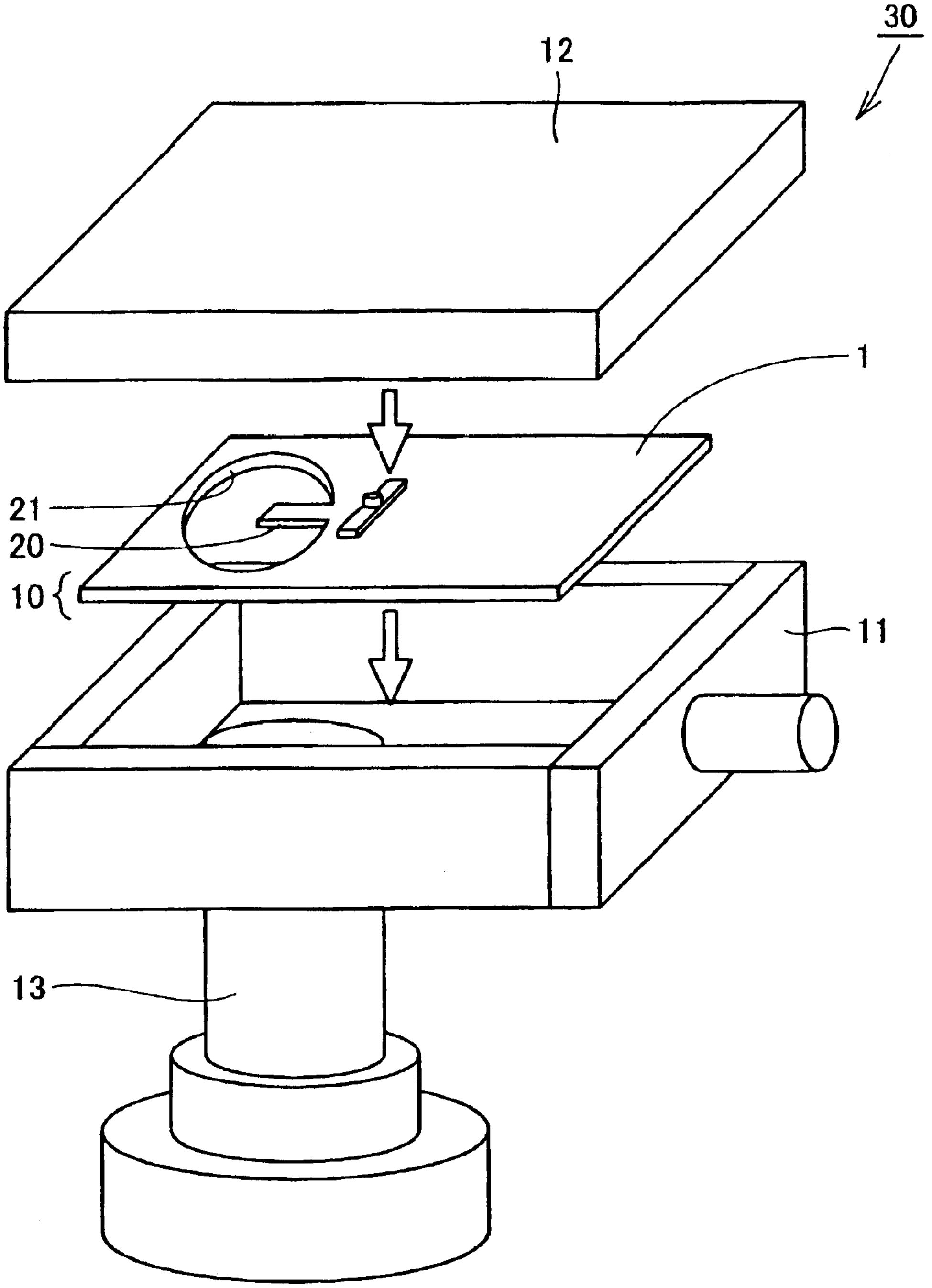
FIG. 5 is an exploded perspective view of the LNB converter employing the multilayer substrate shown in FIG. 1.

The structure of an LNB converter 30 including multilayer substrate 10 is now described. Referring to FIG. 5, multilayer substrate 10 is sandwiched between a metal chassis 11 and a metal frame 12. In the LNB converter, an electric signal having propagated through a waveguide 13 is input to a circuit portion of the multilayer substrate via the probe 20 protruding from the multilayer substrate. The input of the electric signal may be called power supply or feeding.

Metal chassis 11 serves to secure multilayer substrate 10 and provide earth commonly for the multilayer substrate and an external terminal, and also functions as a waveguide for transmission of a high-frequency radiowave signal reflected from an antenna. Metal frame 12 cooperates with metal chassis 11 to realize signal transmission to a circuit on the multilayer substrate, wave shield, ground integrated with the chassis, and airtight sealing of the LNB converter.

On reception, a weak signal from the satellite is transmitted to a circuit of the multilayer substrate as a carrier, high-frequency signal. The signal from the satellite is reflected by the parabola antenna dish, and focuses within the waveguide of the LNB converter. With the probe protruding from the multilayer substrate matching the impedance in the waveguide to that of the circuit, the radiowave propagating through the waveguide is transmitted to the circuit portion of the multilayer substrate, particularly to the microstrip line.

Using the above-described multilayer substrate ensures good NF (noise figure) performance and reduces transmission loss, while supporting the multi-channel transmission/reception.

Second Embodiment

Figure 6:
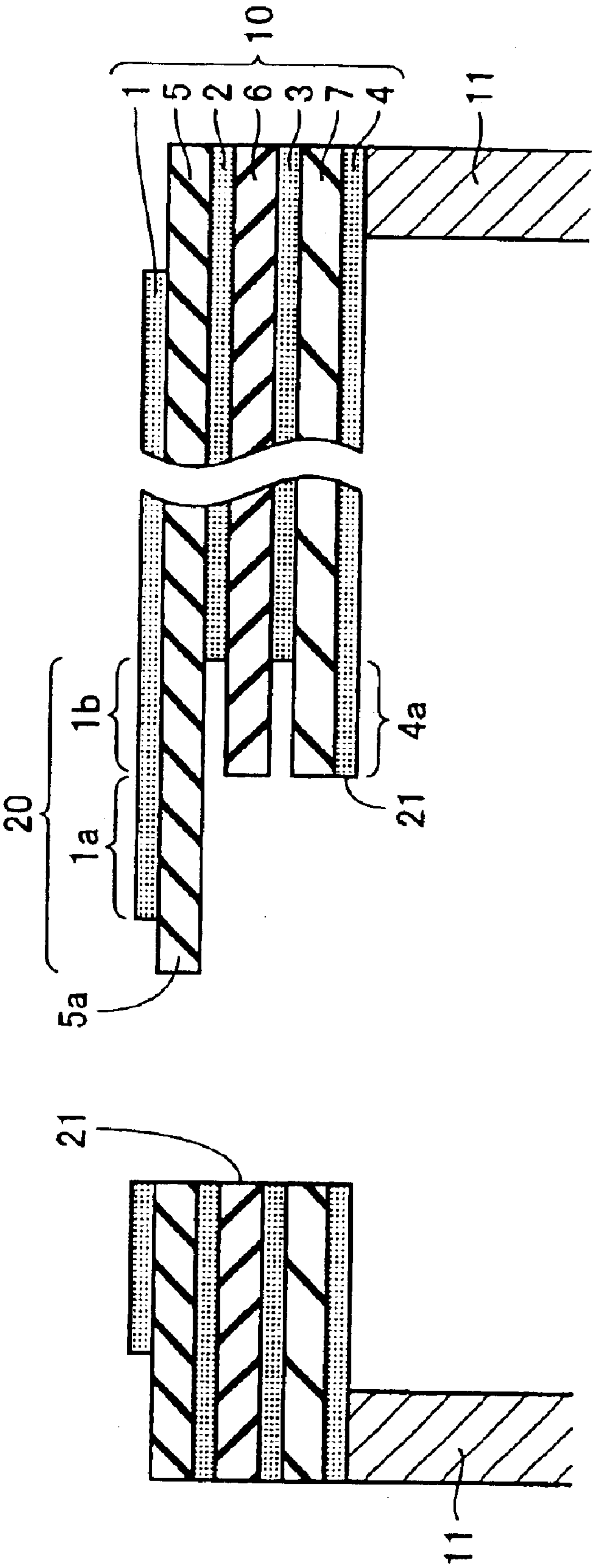
FIG. 6 is a cross sectional view of a multilayer substrate used in an LNB converter according to a second embodiment of the present invention.

FIG. 6 is a cross sectional view of the multilayer substrate used in an LNB converter according to the second embodiment of the present invention. In the present embodiment, a projecting portion 1*a* forming a probe is provided in the first pattern layer 1 constituting the microstrip line, as in the first embodiment. This probe includes a portion protruding from the substrate insulating layer 5; however, it does not include a portion protruding from any other insulating layer or substrate insulating layer.

In the second pattern layer 2 and the third pattern layer 3 that cannot contact the chassis, i.e., in the pattern layers corresponding to the inner layers of the multilayer substrate, portions corresponding to the root portion 1*b* of projecting portion 1*a* are removed. By comparison, in the fourth pattern layer 4, a portion 4*a* corresponding to the root portion 1*b* of projecting portion 1*a* as seen from the top is unremoved. The fourth pattern layer is used as a ground layer.

In this configuration, the ground layer of the circuit is the second pattern layer 2. The fourth pattern layer is used for substitute only in a portion necessary to contact chassis 11, with the second and third pattern layers removed.

In the LNB converter including the multilayer substrate, the earth condition of the probe portion is particularly important, which considerably affects the NF value. The top plan views of the second and third pattern layers are as in FIG. 4.

Figure 7:
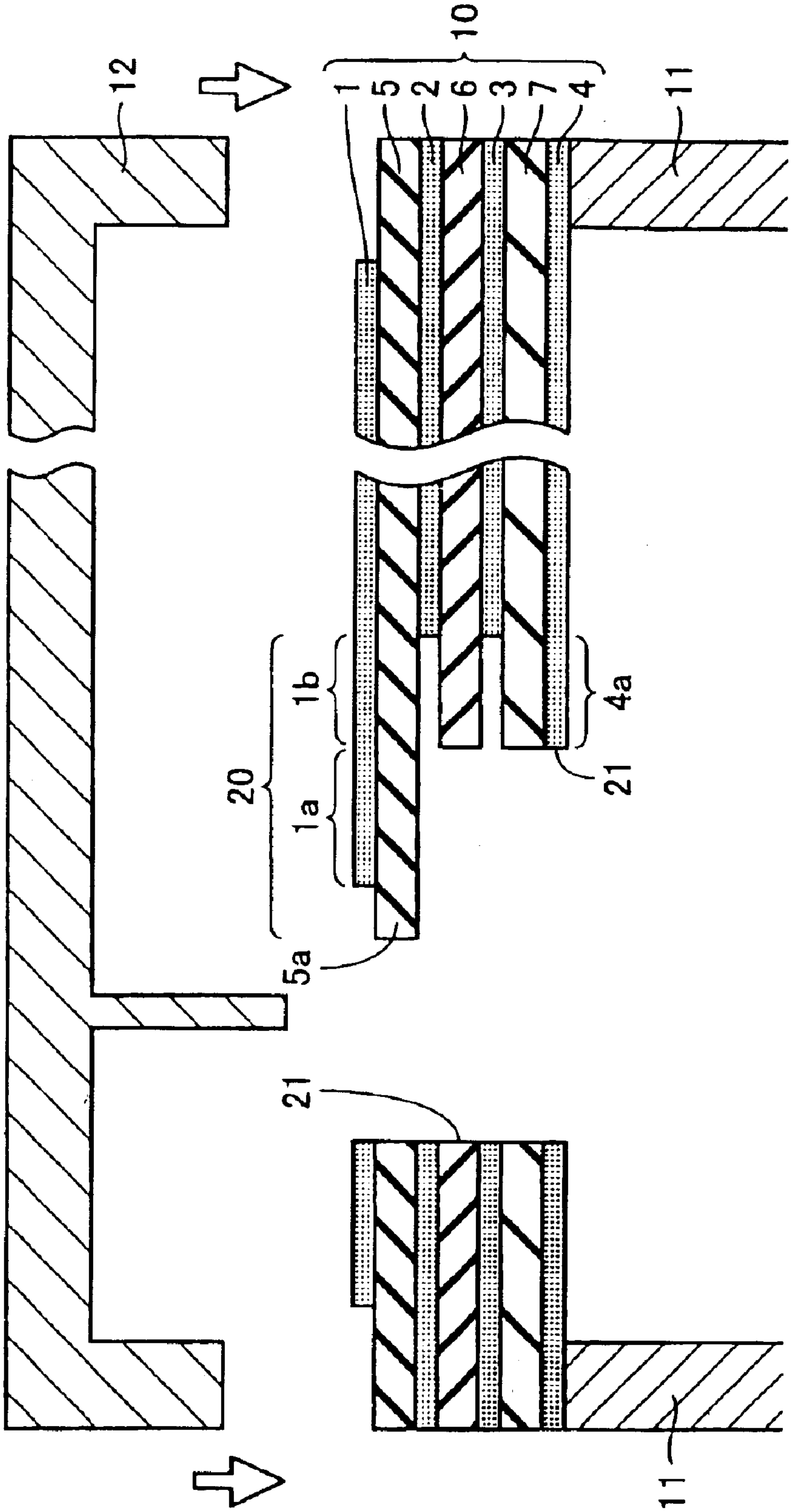
FIG. 7 shows the multilayer substrate of FIG. 6 with a chassis and a frame.

FIG. 7 is a cross sectional view of the multilayer substrate 10 sandwiched between a chassis 11 and a metal frame 12. Multilayer substrate 10 has its peripheral portion sandwiched and secured between metal frame 12 and chassis 11. The functions of metal frame 12 and chassis 11 are as described above. As such, the second and third pattern layers are provided only in the connect portion between the probe and the circuit portion, so that the NF value substantially the same as when using one double-sided substrate can be obtained.

The optimal conditions for the inner pattern layers, or the second and third layers in this case, need to be determined by fabricating several kinds of multilayer substrates and monitoring their NF values. The best mode will be the one with which the transmission loss becomes small. In the LNB converter having the multilayer substrate, chassis and frame configured by the present invention and assembled as shown in FIG. 5, the NF value becomes substantially the same as in an LNB converter formed of one double-sided substrate, and degradation of noise characteristic can be prevented.

Third Embodiment

Figure 8:
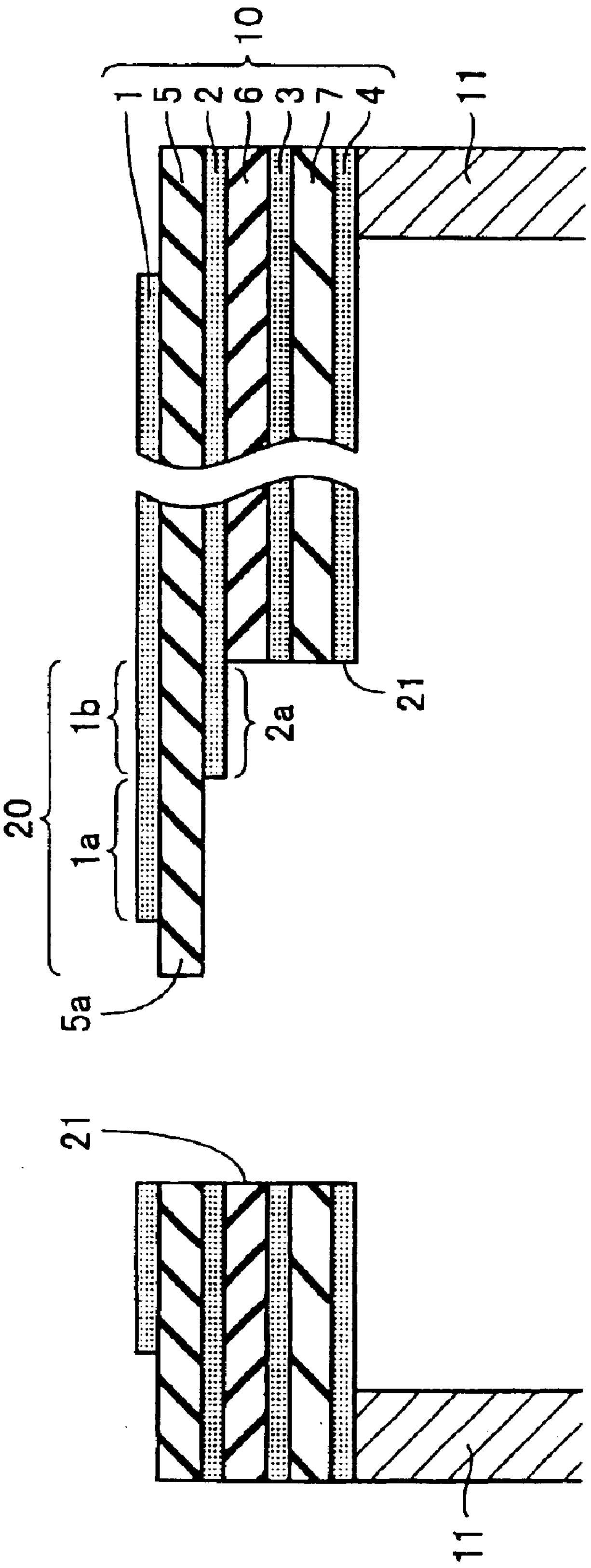
FIG. 8 is a cross sectional view of a multilayer substrate used in an LNB converter according to a third embodiment of the present invention.
Figure 9:
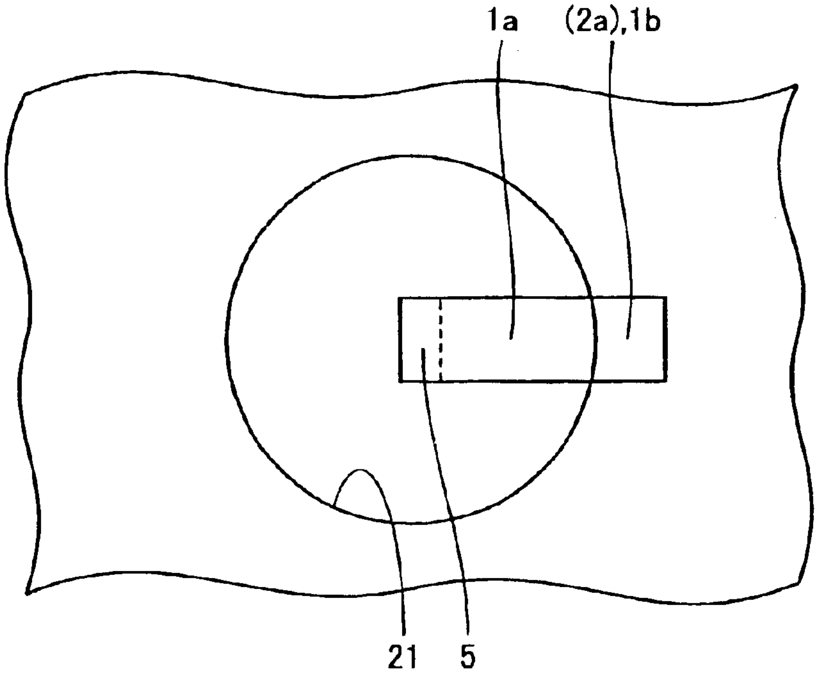
FIG. 9 is a top plan view of the multilayer substrate of FIG. 8 as seen from the chassis side.
Figure 10:
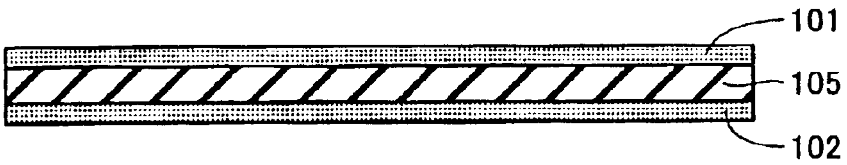
FIG.10 PRIOR ART
FIG. 10 is a cross sectional view of a conventional double-sided substrate.
Figure 11:
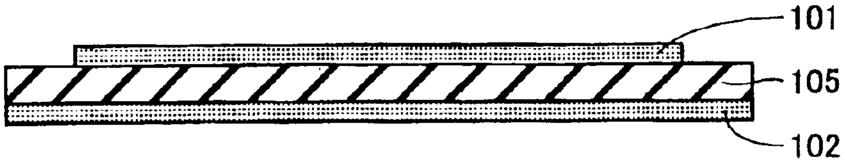
FIG.11 PRIOR ART
FIG. 11 is a cross sectional view of a conventional microstrip line.
Figure 12:
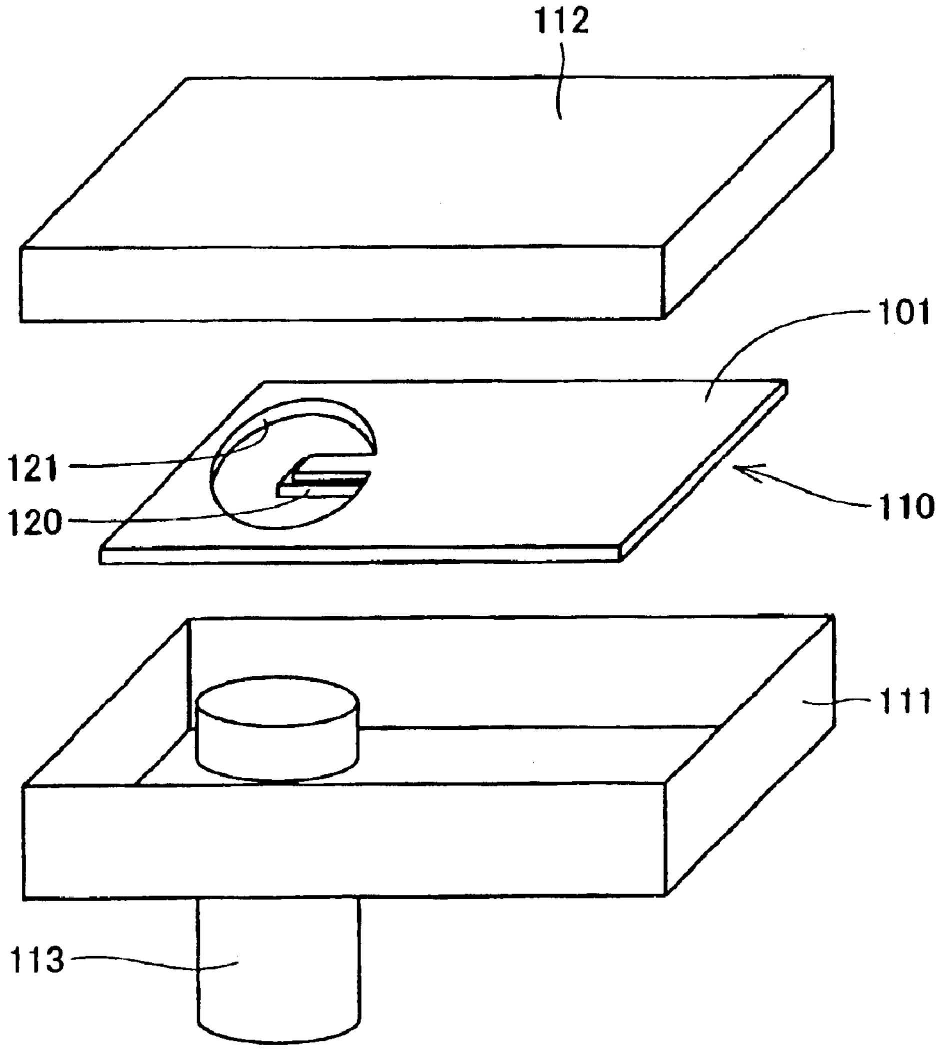
FIG.12 PRIOR ART
FIG. 12 is a perspective view of a signal transmitting portion of a conventional circuit substrate.
Figure 13:
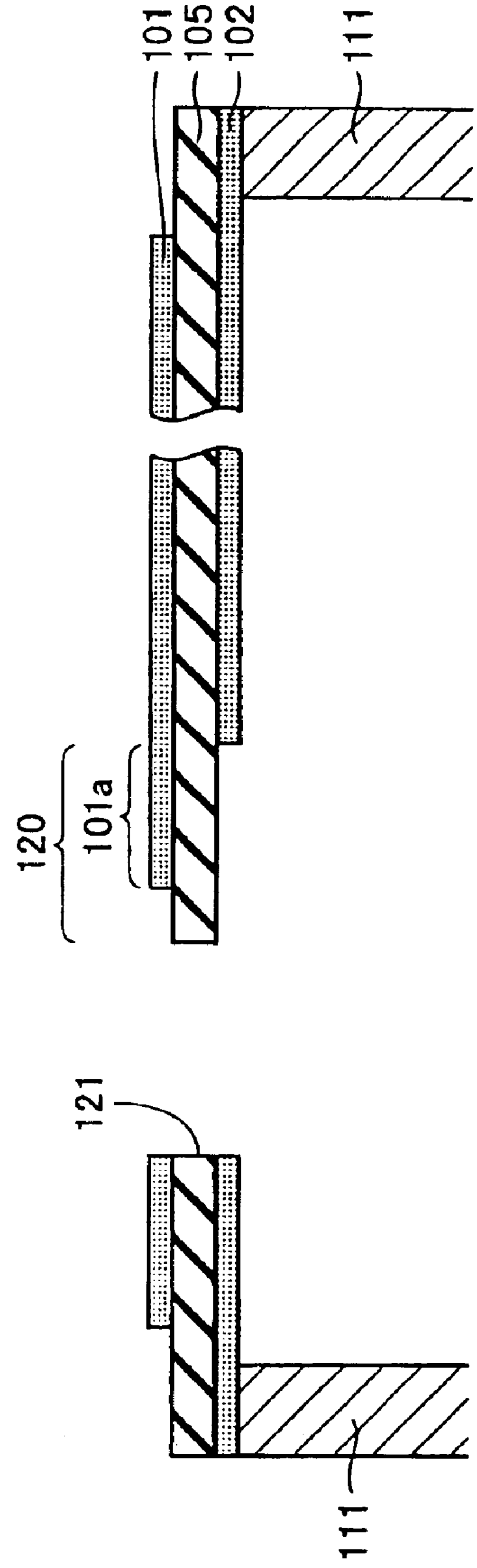
FIG.13 PRIOR ART
FIG. 13 is a cross sectional view of the signal transmitting portion of the conventional double-sided substrate.
Figure 14:
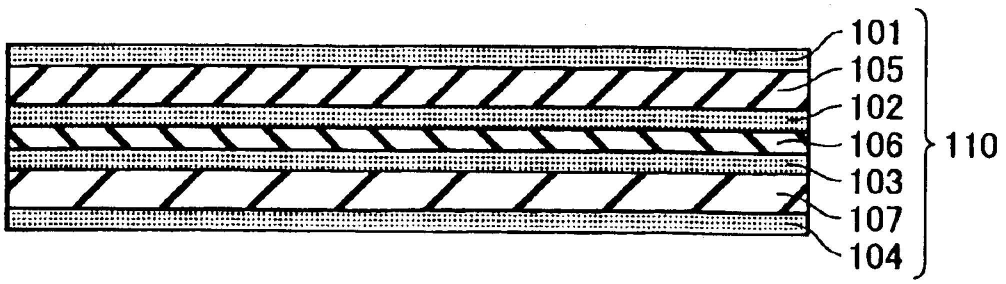
FIG.14 PRIOR ART
FIG. 14 is a cross sectional view of a conventional multilayer substrate.
Figure 15:
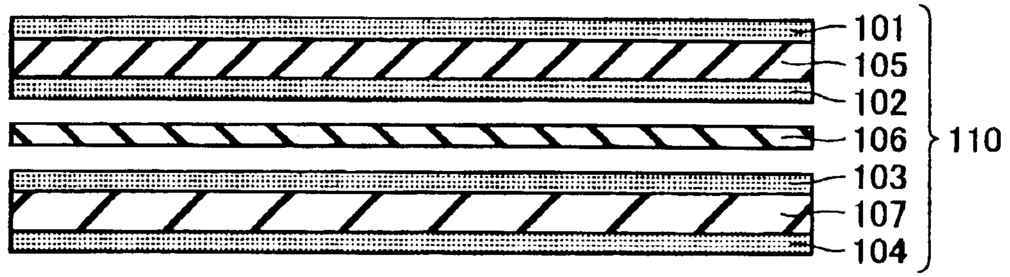
FIG.15 PRIOR ART
FIG. 15 is a cross sectional view illustrating how the four-layer substrate is formed with double-sided substrates.
Figure 16:
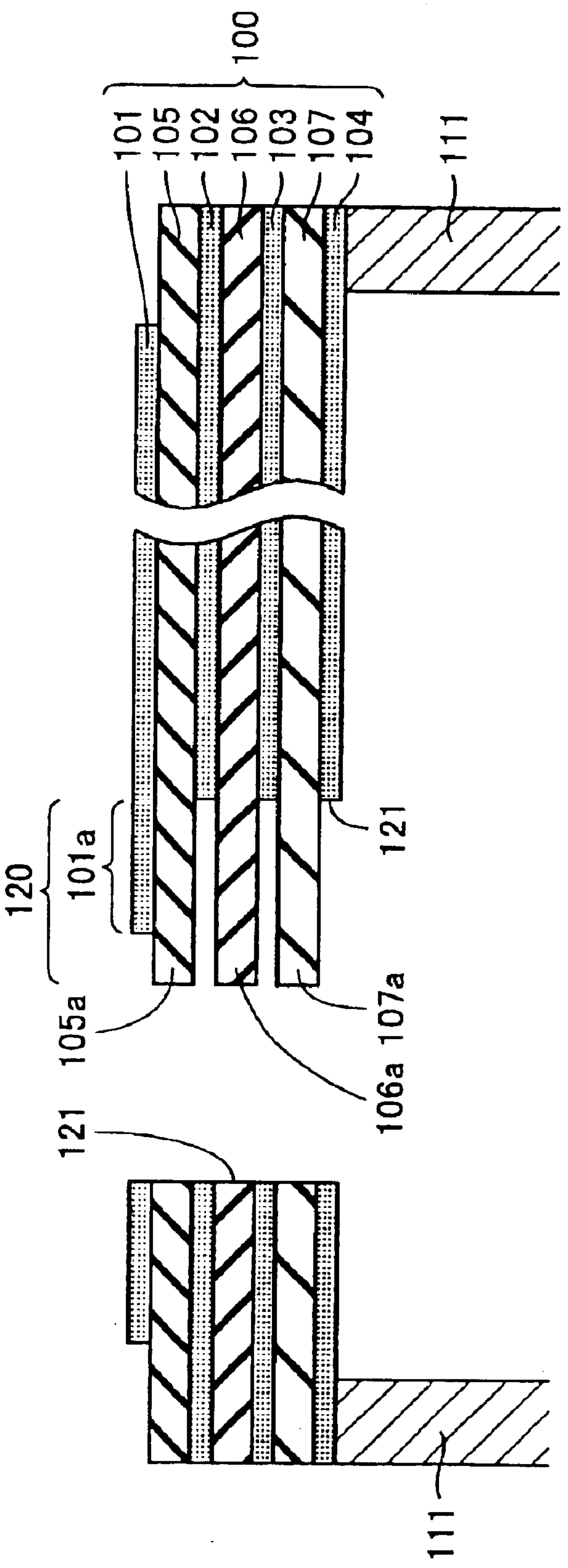
FIG.16 PRIOR ART
FIG. 16 is a cross sectional view of a signal transmitting portion of a conventional four-layer substrate.

FIG. 8 is a cross sectional view of the multilayer substrate used in an LNB converter according to the third embodiment of the present invention. In the multilayer substrate shown in FIG. 8, portions of the third and fourth pattern layers 3 and 4 corresponding to the root portion 1*b* of the projecting portion 1*a* as described above are eliminated. The structure shown in FIGS. 8 and 9 results in less degradation in characteristics and provides ground to the chassis. Accordingly, the present embodiment ensures excellent NF performance and transmission characteristic.

However, the present embodiment is disadvantageous in that, to produce such a multilayer substrate, the respective substrates need to undergo processing prior to bonding thereof, which increases the number of process steps compared to the case of the first and second embodiments where the substrates are subjected to the processing after bonding thereof.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A satellite broadcast reception apparatus including a multilayer substrate having a microstrip line and a probe and formed of at least three pattern layers with a dielectric layer interposed between every adjacent two of said pattern layers, the apparatus causing a radiowave signal from an antenna to propagate through a waveguide to transmit via said probe to said microstrip line, wherein said multilayer substrate has a wave-guiding through hole, said probe is provided to project from said multilayer substrate into the through hole, and of the pattern layers of said multilayer substrate, one surface pattern layer provided with a signal line of said microstrip line has a projecting portion constituting a portion of said probe, and a pattern layer provided with a ground pattern corresponding to said microstrip line has a portion at least overlapping a root portion of said projecting portion as seen from the top and constituting a surface layer on the other side opposite to said root portion, with no other pattern layer interposed between said root portion and the portion constituting the surface layer on the other side.

2. The satellite broadcast reception apparatus according to claim 1, wherein the pattern layer including the portion constituting the surface layer on the other side is a pattern layer which constitutes a substrate surface layer on the opposite side from the surface layer of said multilayer substrate in which the signal line of said microstrip line is formed.

3. The satellite broadcast reception apparatus according to claim 1, wherein the portion constituting the surface layer on the other side is a portion of an inner pattern layer exposed by removing a corresponding portion of the surface pattern layer on the opposite side from the surface layer of said multilayer substrate in which the signal line of said microstrip line is formed.

4. The satellite broadcast reception apparatus according to claim 1, comprising a chassis arranged on said antenna side of said multilayer substrate to enclose a space between said multilayer substrate and the chassis, and a frame arranged to sandwich said multilayer substrate between said chassis and the frame with a space interposed between said multilayer substrate and the frame, the frame constituting an end portion of said waveguide, wherein said one surface pattern layer in which said microstrip line is provided is arranged on said frame side, and the other surface pattern layer in which said ground pattern is provided is arranged on said chassis side.

5. The satellite broadcast reception apparatus according to claim 1, wherein said probe includes the projecting portion of said one surface pattern layer and a projecting portion of said dielectric layer.

6. The satellite broadcast reception apparatus according to claim 5, wherein when said multilayer substrate includes two double-sided substrates, said probe further includes a projecting portion of a bonding insulating layer arranged between said double-sided substrates.

7. A multilayer substrate having a microstrip line and a probe and formed of at least three pattern layers with a dielectric layer interposed between every adjacent two of said pattern layers, wherein said multilayer substrate is provided with a wave-guiding through hole, said probe is provided to project from said multilayer substrate into the through hole, and of the pattern layers of said multilayer substrate, one surface pattern layer provided with a signal line of said microstrip line has a projecting portion constituting a portion of said probe, and a pattern layer provided with a ground pattern corresponding to said signal line has a portion at least overlapping a root portion of said projecting portion as seen from the top and constituting a surface layer on the other side opposite to said root portion, with no other pattern layer interposed between said root portion and the portion constituting the surface layer on the other side.

8. The multilayer substrate according to claim 7, wherein the pattern layer including the portion constituting the surface layer on the other side is a pattern layer constituting a substrate surface layer on the opposite side from the surface layer of said multilayer substrate in which the signal line of said microstrip line is formed.

9. The multilayer substrate according to claim 7, wherein the portion constituting the surface layer on the other side is a portion of an inner pattern layer that is exposed by removing a corresponding portion of the surface pattern layer on the opposite side from the surface layer of said multilayer substrate in which the signal line of said microstrip line is formed.

10. The multilayer substrate according to claim 7, wherein said probe includes the projecting portion of said one surface pattern layer and a projecting portion of said dielectric layer.

11. The multilayer substrate according to claim 10, wherein when said multilayer substrate includes two double-sided substrates, said probe further includes a projecting portion of a bonding insulating layer arranged between said double-sided substrates.

* * * * *

UNITED STATES PATENT AND TRADEMARK OFFICE

CERTIFICATE OF CORRECTION

PATENT NO. : 6,816,028 B2
APPLICATION NO. : 10/401581
DATED : November 9, 2004
INVENTOR(S) : Masahiro Kato It is certified that error appears in the above-identified patent and that said Letters Patent is hereby corrected as shown below:

The Foreign Application Prioirty Data is not listed on the Patent and should be listed as follows:

Title Page

[30] Foreign Application Priority Data

Apr. 17, 2002 [JP] Japan...............................2002-114299

Signed and Sealed this

Sixth Day of March, 2007

JON W. DUDAS
*Director of the United States Patent and Trademark Office*